United States Patent [19]

Komuro et al.

[11] Patent Number: 4,873,622
[45] Date of Patent: Oct. 10, 1989

[54] LIQUID JET RECORDING HEAD

[75] Inventors: Hirokazu Komuro, Hiratsuka; Masami Ikeda, Tokyo, both of Japan

[73] Assignee: Canon Kabushiki Kaisha, Tokyo, Japan

[21] Appl. No.: 230,718

[22] Filed: Aug. 10, 1988

Related U.S. Application Data

[63] Continuation of Ser. No. 77,090, Jul. 23, 1987, abandoned, which is a continuation of Ser. No. 740,494, Jun. 3, 1985, abandoned.

[30] Foreign Application Priority Data

Jun. 11, 1984 [JP] Japan ................ 59-118333

[51] Int. Cl.$^4$ ............... G01D 15/18; H05B 1/00
[52] U.S. Cl. .................. 346/140 R; 346/75; 219/216
[58] Field of Search .............. 346/75, 140 R; 219/216

[56] References Cited

U.S. PATENT DOCUMENTS

| 3,609,294 | 9/1971 | Cady, Jr. et al. | 219/216 |
| 3,700,852 | 10/1972 | Ruggiero | 219/216 |
| 3,832,579 | 8/1974 | Arndt | 310/8.1 X |
| 4,074,284 | 2/1978 | Dexter et al. | 346/140 R |
| 4,463,359 | 7/1984 | Ayata et al. | 346/1.1 |
| 4,499,478 | 2/1985 | Matsufuji et al. | 346/140 R |
| 4,499,480 | 2/1985 | Takatori et al. | 346/140 R |
| 4,528,571 | 7/1985 | Sweet | 346/75 |
| 4,633,274 | 12/1986 | Matsuda | 346/140 R |
| 4,727,384 | 2/1988 | Tsuda | 346/140 R |

FOREIGN PATENT DOCUMENTS

| 3237833 | 4/1983 | Fed. Rep. of Germany . |
| 59-38075 | 3/1984 | Japan . |
| 2106039 | 7/1983 | United Kingdom . |

Primary Examiner—E. A. Goldberg
Assistant Examiner—Gerald E. Preston
Attorney, Agent, or Firm—Fitzpatrick, Cella, Harper & Scinto

[57] ABSTRACT

A liquid jet recording head comprises a recording head unit for discharging liquid from an orifice by applying an energy to the liquid from an energy generator mounted on a substrate in order to form flying droplets, and a substrate member having an external wiring unit for supplying an electrical signal to said energy generator; wherein the electrical connection area for electrically connecting said energy generator and said external wiring unit is integrally molded by an insulative sealing material.

10 Claims, 3 Drawing Sheets

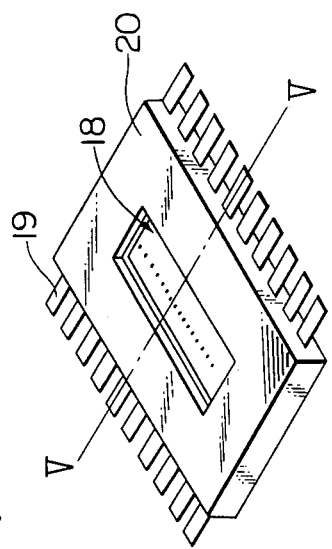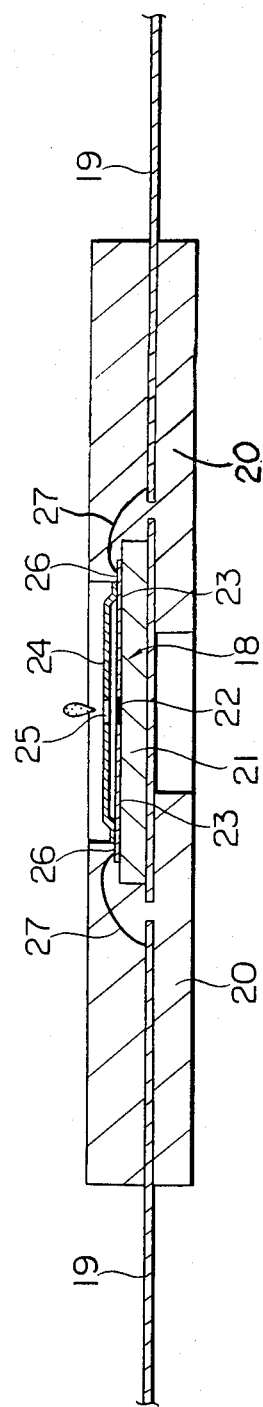

LIQUID JET RECORDING HEAD

This application is a continuation of application Ser. No. 077,090 filed July 23, 1987, now abandoned, which is a continuation of application Ser. No. 740,494, filed June 3, 1985, now abandoned.

BACKGROUND OF THE INVENTION

1. Field of the Invention

The present invention relates to a liquid jet recording head for jetting liquid to form flying droplets for recording on a medium.

2. Description of the Prior Art

A liquid jet recorder records by discharging liquid such as ink from a nozzle of a recording head. This type of recorder is attractive because noise generated during recording is negligibly low, the recorder attains high speed recording and the recording can be made on a plain paper without special treatment.

Among others, the liquid jet recording methods disclosed in Japanese Patent Application Laid-Open No. 51875/1979 and West Germany DOLS 2843064 are unique compared with other liquid jet recording methods because thermal energy is applied to the liquid to produce a motive force for discharging droplets.

In disclosed recording method, the thermal energy causes a rapid increase of volume in the liquid. Liquid is thus discharged from an orifice at an end of a recording head by the force due to this change in state forming flying droplets. The droplets are then deposited on a recording medium to form a record.

The liquid jet recording method disclosed in the West Germany DOLS 2843064, may be applied to a drop-on demand type recording method or a fall line type method having a high density multi-orifice recording head. Hence, it enables rapid formation of a high resolution and high quality image.

The recording head used in the above recording method comprises a liquid discharge unit including an orifice for discharging liquid, a liquid flow path having a heating unit by which a thermal energy for discharging droplets is applied to the liquid, and an electro-thermal converter for generating the thermal energy.

In a prior art recorder having a liquid jet recording head, wiring for the recording head extends across a substrate to a flexible wiring cable connecting the recording head to a drive circuit which produces an electrical signal to drive the electro-thermal converter of the recording head. The connecting pads of the flexible cable, for applying the electrical signal to the recording head, conventionally has been connected to wiring pads of the recording head by a press-contact method, a wire bonding method, soldering or by thermal a press-contact method. The flexible cable is then fixed to the recording head.

The substrate of the liquid jet recording head has one of a number of different wiring and heat generating resistor patterns depending on an the desired end product, e.g. eight lines with 2.5 lines/mm for a desk top calculator printer or sixteen lines with 4 lines/mm for a facsimile machine.

FIG. 1 shows a structure of a prior art liquid jet recording head. Numeral 1 denotes substrate, numeral 2 denotes electrodes through which electrical signals are supplied, numeral 3 denotes heat generating resistors which are electro-thermal converters, numeral 4 denotes an area of a protection film which protects the electrodes and the heat generating resistors from liquid, and numeral 5 denotes a flexible cable for connecting the substrate to a drive circuit.

In the prior art liquid jet recording head, the wiring area 6 is large and hence the quantity of the substrate material required for each head is large. Since the substrate material is made of an expensive material such as Si, the increase of the cost of the recording head due to this area of substrate is not negligible.

The excessive size of the substrate due to this unnecessary area reduces the efficiency of the etching, sputtering or vapor deposition process and impedes mass-production.

Further, because the mask used in production changes from product to product, the etching, sputtering or vapor deposition process becomes complex and the yield is lowered due to misoperation.

Still further, short-circuiting and bridging of the wiring occur with the same probability throughout the substrate area. Thus, the unnecessary area causes a reduction of the yield.

In a proposed liquid jet recording head, a substrate area having the heat generating resistors formed therein is separated from the substrate on which the recording head is formed and the major electrodes of the separate substrate and the electrodes of the recording head are electrically connected. The electrical connection of the recording head (discharge element) and the major electrodes (external wiring unit) is illustrated in FIGS. 2 and 3.

Numeral 7 denotes the discharge element. A liquid chamber 8 is fixed to a side of the discharge element 7 and a plurality of orifices 9 for the liquid are formed in the liquid chamber 8. Heat generating elements 11 are formed on a side of the discharge element facing a substrate 10 opposite the orifices 9. Numeral 12 denotes lead electrodes for supplying a current to each heat generating element 11.

The discharge element 7 is mounted on a substrate 14 of an external wiring unit 13 the electrodes 15 on the substrate 14 and the lead electrodes 12 are wire-bonded by wires 16. The bonding is sealed by sealing agent 17 to enhance reliability.

This structure, however, raises the following problem.

In order to improve the print quality in the liquid jet recording head, it is necessary to reduce the spacing between the orifices 9 and the recording paper. However, since the sealing agent 17 projects from the orifice plane, the spacing between the orifice plane and the recording paper cannot be reduced.

Further, as the spacing between the orifice plane and the recording paper is reduced, the sealing agent 17 rubs against the recorded paper, lowering the print quality. Alternatively, the sealing agent 17 is worn by the recording paper and the reliability of the sealing agent 17 and the reliability of the connecting area are lowered.

SUMMARY OF THE INVENTION

It is an object of the present invention to provide the liquid jet recording head which improves a reliability of electrical connection between an orifice element and an external wiring unit and reduces the cost thereof.

It is another object of the present invention to provide a liquid jet recording head having a recording head unit for discharging liquid from orifices by applying energy to the liquid by an energy generator arranged on a first substrate in order to form flying droplets, and a second substrate member having an external wiring unit for supplying an electrical signal to said energy generator, wherein an electrical connection area of the energy generator and the external wiring unit is sealed by an insulative sealing material.

BRIEF DESCRIPTION OF THE DRAWINGS

FIG. 4 is a perspective view of one embodiment of the present invention, and

FIG. 5 is a sectional view taken along a line V—V in FIG. 4.

DETAILED DESCRIPTION OF THE PREFERRED EMBODIMENTS

Figure 1:
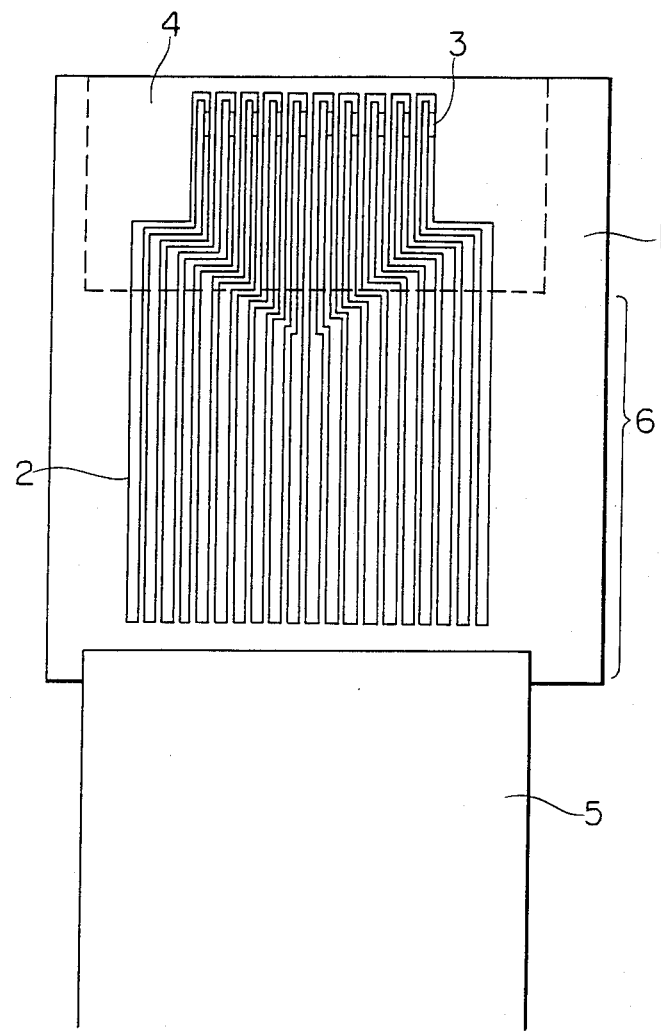
FIG. 1 is a plan view of a prior art structure.
Figure 2:
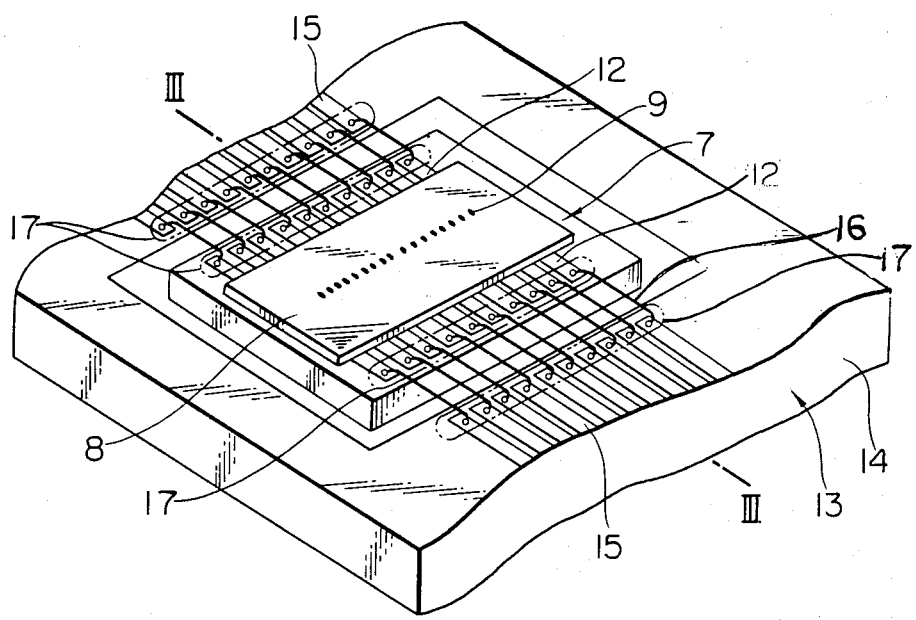
FIG. 2 is a perspective view of another prior art structure.
Figure 3:
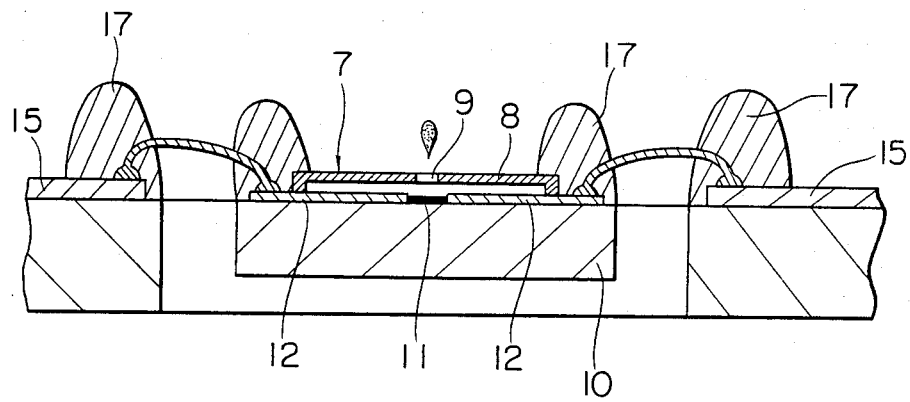
FIG. 3 is a sectional view taken along a line III—III of FIG. 2.

FIGS. 4 and 5 show one embodiment of the present invention. Numeral 18 denotes a discharge element, numeral 19 denotes a metal frame and numeral 20 denotes resin molded by a low pressure transfer mold method.

The discharge element 18 which is a recording head unit has a heat generating resistant layer 22 formed on a support 21 made of glass, ceramics or silicon, and lead electrodes 23 formed thereon. A protection layer (not shown) may be formed thereon as required. Numeral 24 denotes a liquid chamber forming member and numeral 25 denotes orifices.

The heat generating resistance layer 22 may be made of any material which generates heat when it is energized. For example, the material may be tantalum nitride, nichrome, silver-paradium alloy, silicon semiconductor, or a boron compound of metal such as hafnium, lanthanum, zirconium, titanium, tantalum, tangusten, molybdenum, niobium, chromium or banadium.

A metal-boron composition is particularly preferable as the material of the heat generating resistance layer 22. The most preferable composition is hafnium boronide, the next preferable ones being zirconium boronide, lanthanum boronide, tantalum boronide, banadium boronide and niobium boronide.

A heat generating resistance layer 22 made of one of those materials is formed by a electron beam vapor deposition method or a sputtering method.

The electrode 23 may be made of a conductive material capable of forming a pinholeless inorganic insulative layer thereon, such as Al, Ta, Mg, Hf, Zr, V, W, Mo, Nb, Si, or a composition thereof. Electrodes 23 made of one of these materials are formed by a vapor deposition method at predetermined areas with a predetermined size, shape and thickness.

The protective layer (not shown) may be made of an inorganic oxide such as $SiO_2$, an inorganic nitride such as $Si_3Na$, a transition metal oxide such as titanium oxide, vanadium oxide, niobium oxide, molybdenum oxide, tantalum oxide, tangsten oxide, chromium oxide, zirconium oxide, hafnium oxide, lanthanum oxide, ittrium oxide or manganese oxide, a metal oxide such as alminum oxide, calcium oxide, strontium oxide, barium oxide, silicon oxide or composition thereof, a high resistance nitride such as silicon nitride, aluminum nitride, boron nitride or tantalum nitride, a composition of the oxide and the nitride, or a semiconductor bulk such as an amorphous silicon or amorphous selenium, which generally has a low resistance but may have the high resistance in a course of sputtering, CVD, vapor deposition, vapor phase reaction or liquid coating method.

If required, a second protection layer made of oxide, carbonide, nitride or a boronide of a metal such as Al, Ta, Ti, Zr, Hf, V, Nb, Mg, Si, Mo, W, Y, La or an alloy thereof, may be formed. Pads made of gold are plated, screen-printed or vapor-deposited, as required, on an area 26 which is not covered by the liquid chamber. Finally, the liquid chamber forming member 24 for forming the liquid chamber is bonded by an epoxy or a silicone adhesive material. The liquid chamber forming member is formed by an electro-casting method by metal plating. The material thereof may be a noble metal such as nickel, copper, chromium, cobalt or a compound (e.g. phosphide) thereof. It may be molded by resin, or the electro-casted liquid chamber forming member 24 may be bonded to a photoresistive film. In this manner, the discharge element 18 is formed.

The discharge element 18 is then bonded to the metal frame 19 which is the substrate member having the external wiring unit formed thereon. The adhesive material is made of a high thermal conductivity silver paste, silver epoxy or epoxy. The lead frame which constitutes the external wiring unit and the lead electrodes 23 of the discharge element 18, is wire-bonded to electrically connect the energy generator and the lead frame which is the external wiring unit. The wires 27 are made of gold or aluminum. The metal frame 19 is made of a Fe-Ni alloy (e.g. 42 alloy) or a copper alloy and is formed by etching or punching. At least those areas of the lead which are to be wire-bonded are plated with gold or silver, as required.

After the wire-bonding of the metal frame, the metal frame is placed in a die for low pressure transfer molding.

The low pressure transfer molding die is designed to mold the metal frame into the shape shown in FIG. 4. It is designed to minimize flash on the discharge element and completely seal the electrical connection area.

The low pressure transfer molding resin may be an epoxy resin or a silicone resin. In the present embodiment, epoxy resin is used in view of cost reduction, water resisting property and chemical resisting property. The discharge element is made of a high thermal conductivity resin because of the large quantity of heat generated. Such resin may be Nitto-denko MP3500, MP4000, MP4300, Sumitomo Bakelite EME 5500 or EME 6500. The selected resin is molded in the low pressure transfer molding method to produce the package shown in FIG. 4.

In this manner, the sealing of the wire bonding area is made flat and thin. Accordingly, the spacing between the orifice plane and the recording paper can be reduced (to approximately 0.5 mm) and the print quality is improved.

Low pressure transfer molding is applicable to mass production and hence the total cost can be reduced. The mold can be treated as one part and a yield is improved. Thus, the total cost is further reduced.

As described hereinabove, in accordance with the present invention, since the electrical connection area of the discharge element and the external wiring unit is resin-molded in a flat and thin shape, the spacing between the orifice plane and the recording paper is reduced and the print quality is improved. In addition, since the resin in the connection area does not rub the recording paper, the reliability of the connection area is improved.

In a present invention, the protection layer is formed on the electrodes and/or the heat generating resistance layer. If the electrodes and/or the heat generating resistance layer are made of materials which are not eroded by the liquid, a protection layer is not necessary. Further, even if a protection layer is formed, it need not be a dual layer structure as specifically shown in the embodiment.

What we claim is:

1. A liquid jet recording head comprising:
   a recording head unit including a support having an energy generator thereon and a cover attached to said support to form therewith a liquid chamber, wherein said cover has an orifice therein opposed to said energy generator for discharging liquid in said liquid chamber as flying droplets from said orifice by operating said energy generator;
   a substrate member comprising a frame having an external wiring unit including at least one connector for supplying an electrical signal to said energy generator; and
   an electrical connection area, electrically connecting said energy generator and said external wiring unit, sealed by an insulative sealing material, wherein said recording head unit and said substrate member are molded into an integral unit by said sealing material and said connector extends externally of said integral unit.

2. A liquid jet recording head according to claim 1 wherein said energy generator is an electro-thermal conversion device.

3. A liquid jet recording head according to claim 1 wherein said insulative sealing material is resin.

4. A liquid jet recording head according to claim 3 wherein said resin is epoxy resin or silicone resin.

5. A liquid jet recording head according to claim 1 wherein said electrical connection is done by a wire-bonding method.

6. A liquid jet recording head according to claim 5 wherein a gold or aluminum wire is used in said wire-bonding method.

7. A liquid jet recording head according to claim 1 wherein said substrate member is a lead frame.

8. A liquid jet recording head according to claim 7 wherein said lead frame is made of metal.

9. A liquid jet recording head according to claim 1 wherein said sealing material has a plane substantially parallel to a plane of the orifice.

10. A liquid jet recording head according to claim 1 wherein said energy generator generates thermal energy for forming liquid droplets.

* * * * *

UNITED STATES PATENT AND TRADEMARK OFFICE
CERTIFICATE OF CORRECTION

Page 1 of 2

PATENT NO. : 4,873,622
DATED : October 10, 1989
INVENTOR(S) : HIROKAZU KOMURO, ET AL.

It is certified that error appears in the above-identified patent and that said Letters Patent is hereby corrected as shown below:

COLUMN 1

Line 27, "disclosed" should read --the disclosed-- and "the" (second occurrence) should be deleted.
Line 30, "state" should read --state,--.
Line 35, "fall line" should read --full line--.
Line 52, "has" should read --have--.
Line 54, "thermal a" should read --a thermal--.
Line 59, "an" should be deleted.

COLUMN 2

Line 40, "unit 13 the" should read --unit 13 and the--.
Line 60, "provide the" should read --provide a--.
Line 61, "a" should read --the--.

COLUMN 3

Line 26, "heat generating resistant layer 22" should read --heat generating resistance layer 22--.
Line 35, "silver-paradium" should read --silver-palladium--.
Line 37, "tangusten," should read --tungsten,--.
Line 38, "banadium" should read --vanadium--.
Line 44, "banadium" should read --vanadium--.
Line 46, "a" should read --an--.
Line 59, "tangsten" should read --tungsten--.
Line 61, "al-" should read --alu- --.
Line 68, "the high" should read --a high--.

UNITED STATES PATENT AND TRADEMARK OFFICE
CERTIFICATE OF CORRECTION

PATENT NO. : 4,873,622
DATED : October 10, 1989
INVENTOR(S) : HIROKAZU KOMURO, ET AL.

It is certified that error appears in the above-identified patent and that said Letters Patent is hereby corrected as shown below:

COLUMN 4

Line 1, "a course" should read --the course--.

COLUMN 5

Line 1, "a" should read --the-- and "the" should read --a--.
Line 16, "as flying droplets" should be deleted.

COLUMN 6

Line 25, "forming liquid droplets." should read --discharging liquid.--.

Signed and Sealed this

Twenty-first Day of April, 1992

Attest:

HARRY F. MANBECK, JR.

*Attesting Officer*  *Commissioner of Patents and Trademarks*